(12) United States Patent
Lee et al.

(10) Patent No.: US 6,633,250 B2
(45) Date of Patent: Oct. 14, 2003

(54) AVERAGE BUBBLE CORRECTION CIRCUIT

(75) Inventors: Chao-Cheng Lee, Hsinchu (TW); Pao-Cheng Chiu, Hsinchu (TW)

(73) Assignee: Realtek Semiconductor Corp. (TW)

( * ) Notice: Subject to any disclaimer, the term of this patent is extended or adjusted under 35 U.S.C. 154(b) by 0 days.

(21) Appl. No.: 10/108,097

(22) Filed: Mar. 27, 2002

(65) Prior Publication Data

US 2002/0167428 A1 Nov. 14, 2002

(30) Foreign Application Priority Data

Mar. 28, 2001 (TW) ........................................ 90107333 A

(51) Int. Cl.[7] ................................................. H03M 1/36
(52) U.S. Cl. ........................................ 341/160; 341/155
(58) Field of Search ................................. 341/160, 100, 341/101, 118, 120, 94, 97, 98, 96

(56) References Cited

U.S. PATENT DOCUMENTS 5,995,028 A * 11/1999 Tai .............................. 341/100
6,388,602 B1 * 5/2002 Yang ........................... 341/159

FOREIGN PATENT DOCUMENTS

TW 418569 3/1998

* cited by examiner

*Primary Examiner*—Brian Young

(57) ABSTRACT

The present invention is to provide an average bubble correction circuit which will expand the range of bubble error correction and will detect the proper position of the 1/0 state-conversion points of the thermometer codes to low down the error rate that caused by the ROM decoding. The average bubble correction circuit is used in the analog to digital converter and will convert the thermometer code obtained from the comparator of the analog to digital converter into the 1/0 state-conversion point.

19 Claims, 14 Drawing Sheets

|   | (a) | (b) | (c) | (d) | (e) | (f) |
|---|---|---|---|---|---|---|
|   | 0 | 0 | 0 | 0 | 0 | 0 |
|   | 0 | 0 | 0 | 0 | 0 | 0 |
|   | 0 | 0 | 0 | 0 | 1 | 0 |
|   | 0 | 0 | 0 | 0 | 0 | 0 |
|   | 0 | 0 | 1 | 0 | 0 | 0 |
|   | 0 | 0 | 0 | 0 | 1 | 1 |
|   | 1 | 0 | 0 | 0 | 1 | 1 |
| → The Best Stop Point | 0 | 1 | 1 | 1 | 0 | 0 |
|   | 1 | 1 | 1 | 1 | 0 | 0 |
|   | 1 | 0 | 1 | 1 | 1 | 1 |
|   | 1 | 1 | 1 | 1 | 1 | 1 |
|   | 1 | 1 | 1 | 0 | 1 | 1 |
|   | 1 | 1 | 1 | 1 | 1 | 1 |
|   | 1 | 1 | 1 | 1 | 1 | 1 |

FIG. 5A

|  | (a) | (b) | (c) | (d) | (e) | (f) |
|---|---|---|---|---|---|---|
|  | 0 | 0 | 0 | 0 | 0 | 0 |
|  | 0 | 0 | 0 | 0 | 1 | 0 |
|  | 0 | 0 | 0 | 0 | 0 | 0 |
|  | 0 | 0 | 1 | 0 | 0 | 0 |
|  | 0 | 0 | 0 | 0 | 0 | 1 |
|  | 1 | 0 | 0 | 0 | 0 | 0 |
|  | 0 | 1 | 1 | 1 | 1 | 0 |
| The Best Stop Point → | 0 | 0 | 0 | 0 | 0 | 0 |
|  | 0 | 0 | 0 | 0 | 0 | 1 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |

FIG. 5B

|  | (a) | (b) | (c) | (d) | (e) | (f) |
|---|---|---|---|---|---|---|
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 1 |
|  | 1 | 0 | 0 | 0 | 0 | 0 |
|  | 0 | 1 | 1 | 1 | 1 | 0 |
|  | 1 | 0 | 0 | 0 | 0 | 0 |
|  | 0 | 0 | 0 | 0 | 0 | 1 |
|  | 0 | 1 | 0 | 0 | 0 | 0 |
|  | 0 | 0 | 0 | 0 | 0 | 0 |
|  | 0 | 0 | 0 | 1 | 0 | 0 |
|  | 0 | 0 | 0 | 0 | 0 | 0 |

The Best Stop Point

FIG. 5C

|  | (a) | (b) | (c) | (d) | (e) | (f) |
|---|---|---|---|---|---|---|
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 1 | 1 |
|  | 0 | 0 | 0 | 0 | 1 | 1 |
| The Best Stop Point → | 1 | 1 | 1 | 1 | 0 | 1 |
|  | 1 | 1 | 1 | 1 | 0 | 0 |
|  | 1 | 1 | 1 | 1 | 1 | 1 |
|  | 1 | 1 | 1 | 1 | 1 | 1 |
|  | 1 | 1 | 1 | 0 | 1 | 1 |
|  | 1 | 1 | 1 | 1 | 1 | 1 |
|  | 1 | 1 | 1 | 1 | 1 | 1 |

FIG. 5D

| An-2 | An-1 | An | An+1 | An+2 | En |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 1 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 1 | 1 |

AVERAGE BUBBLE CORRECTION CIRCUIT

BACKGROUND OF THE INVENTION (a) Field of the Invention

The present invention relates to the average bubble correction circuit in the analog to digital converter. The average bubble correction circuit can convert the thermometer code obtained from the comparator of the analog to digital converter into the 1/0 state-conversion point.

(b) Description of the Prior Arts

In the deep submicron technology, the channel length will be shorter and the breakdown voltage will be decreased when the device is made smaller. Therefore, in order to improve the reliability of the circuit and to obtain the better yield of the product, the working voltage has to be decreased to a certain value. The device whose channel length ($\lambda$) is 3.5 micrometers can take the working voltage 3.3 V. However, when the channel length ($\lambda$) of the device is decreased to 2.5 micrometers, the working voltage 3.3 V will cause the problem of reliability. The working voltage has to be decreased to 2.5 V accordingly to maintain the reliability when the channel length is changed to 2.5 micrometers. In general, the working voltage needs to be decreased as the manufacturing process advanced. It is the nature in physics that the decrease of the working voltage is proportional to the decrease of the channel length. Example that when the channel length ($\lambda$) decreasing from 3.5 micrometers to 2.5 micrometers, the working voltage has to be decreased from 3.3 V to 2.5 V. Another factor is the threshold voltage that affects the working voltage, the threshold voltage is not changing in proportion with the change of the channel length ($\lambda$) accordingly. For example, when the channel length ($\lambda$) changing from 3.5 micrometers to 2.5 micrometers (the ratio is 0.09), the threshold voltage will change from 0.7 V to 0.56 V (the ratio is 0.8), which means, for a designer of a circuit, the linear voltage range is decreased, for example, from 1.5V to 1 V.

The main disadvantages of the analog to digital converter are as follows: (1) signal range (2) resolution (N bits) (3) random offset voltage of the device. The least significant bit voltage $V_{LSB}$ can be represented as $V_{LSB}=V_n/2^N$ when the signal range is $V_n$ and the resolution is N bits.

The practical circuit has to resolute a least significant bit voltage $V_{LSB}$ (strictly, to ½$V_{LSB}$) in order to meet the demand of the N-bit analog to digital converter. From the formula above, the least significant bit voltage $V_{LSB}$ is proportional to the signal range $V_n$ and the signal range $V_n$ has to be in the linear voltage range. In advanced manufacturing process, the signal range $V_n$ and the least significant bit voltage $V_{LSB}$ will be decreased when the working voltage decreased.

The random offset voltage $V_{os}$ of MOS and the thermal noise $V_n$ are the bottlenecks of decreasing the least significant bit voltage $V_{LSB}$. Any circuit will not detect the degree of the signal when the least significant bit voltage is smaller than the thermal noise or is smaller than the random offset voltage. With the auto correction circuit or the offset calibration circuit, the better resolution can be obtained. Example that the signal range is 1.5 V when the working voltage is 3.3 V in the process whose channel length is 3.5 micrometers, the least significant bit voltage of the 8-bit analog to digital converter is equal to 5.86 mV and the random offset voltage is between 10 mV and 20 mV, obviously, the $V_{LSB}$ is much smaller then the $V_{os}$. Therefore, the probability of the generating of the bubble will increase for the flash analog to digital converter. And, vary likely; several bubbles will be generated in the same time.

The effects of the bubbles are as follows: (1) the error of the decoding of read only memory (ROM) (2) the decreasing of the rate of the noise of the signal (3) the increasing of the bit error rate. When the bubbles are more than one, the number of the inputs of the decoder which is preset will be more than one "1" and will not be corrected, and further result in the error of the binary code of the outputs. And the current passing through the transistor will increase extremely and the bit error rate will cause the data sampling fail to meet the specification. The yield will not be improved and the cost will increase. So, the better error correction circuit is vary important for the analog to digital converter in the advanced manufacturing process.

FIG. 1 is showing the schematics of the flash analog to digital converter in prior art. The output of the comparator 12 in the flash analog to digital converter 10 is the thermometer code. If the input voltage of the comparator is higher than the reference voltage, the logical output is "1". If lower, the logical output will be "0". The analog signal converted to the digital signal is shown in FIG. 2. The analog signal outputted from a series of the comparators 12 will be similar to the thermometer code style in FIG. 2. In order to form the thermometer code style, all "0" will be above the input voltage and all "1" will be under the input voltage. The boundary of the "1" and "0" can reflect the degree of the input voltage. The thermometer code will be converted to 1-OF-N code by 1/0 state-conversion detector and will be decoded to binary code by ROM 14.

Because of (1) high slew rate input (2) the difference of the clock pulse distribution (3) process offset, the micro difference of the random input offset voltage and the response time of the comparators will result in one or many "0"s appear in a series of "1", or one or many "1"s appear in a series of "0", and this is so called bubble error.

When the errors happened in the analog to digital converter, two or more 1/0 state-conversion points will appear, and which will cause errors occur in the process of decoding and further cause the increasing of the bit error rate and the decreasing of the noise signal rate of the analog to digital converter. The problem of the error code of the bubble can be solved by using three-end input logical device that referring three continuous thermometer codes.

FIG. 3A is showing the diagram of the three-end input logical device which can detect the 1/0 state-conversion point with input "001". When the thermometer codes that input to the AND gate 30 of the three-end logical input device is "001" and the output signal of the AND gate 30 is "1", it is indicating that the 1/0 state-conversion point has been detected, otherwise, the output signal of the AND gate 30 is "0".

FIG. 3B is showing the diagram of the three-end input logical device which can detect the 1/0 state-conversion point with input "011". When the thermometer codes that input to the AND gate 32 of the three-end logical input device is "011" and the output signal of the AND gate 32 is "1", it is indicating that the 1/0 state-conversion point has been detected, otherwise, the output signal of the AND gate 30 is "0".

The thermometer codes will be converted to 1-OF-N codes by using the three-end logical input device and will be further decoded into the binary codes.

FIG. 4 is showing the condition that the bubble being detected by the three-end logical input device in prior art. The disadvantage of the three-end logical input device is that the 1/0 state-conversion point can be detected, but the result is not the best one. For example, in FIG. 4, the three-end logical input device will use "011" or "001" to detect the 1/0 state-conversion point, and the result is showing in the (a) series and (b) series thermometer codes in FIG. 4. When the thermometer codes of the comparator 40 and the comparator 42 generate the bubbles, the three-end logical input device will not detect which comparator generating the errors. As shown in FIG. 4, the 1/0 state-conversion points that detected by the (a) series and the (b) series thermometer codes are not the proper ones, however, the (c) series thermometer codes will generate the best result.

FIG. 5B and FIG. 5C are showing the several kinds of results that the three-end logical input device that detecting bubbles in prior art. FIG. 5A is showing the six combinations of the thermometer codes. The result of the test of the three-end logical input device in the condition of "001" is shown in FIG. 5B. The result of the test of the three-end logical input device in the condition of "011" is shown in FIG. 5C. As shown, when the bubbles are over one, the three-end logical input device will not correct the error properly. More, when the number of the bubble is 1, but the depth of the number is over 2, the three-end logical input device only can correct the error in one direction. As shown in FIGS. 5B and 5C, with the condition "001", the three-end logical input device can correct the thermometer codes of the (a) series, the (b) series and the (d) series, but can not correct the thermometer codes of the (c) series, the (e) series and the (f) series since the depth of the bubbles in the (c) series and the (e) series are over 2 and the (f) series generating two bubbles. With the condition "011", the three-end logical input device can correct the thermometer codes of the (a) series, the (c) series and the (e) series, but can not correct the thermometer codes of the (b) series, the (d) series and the (f) series since the depth of the bubbles in the (b) series and the (d) series are over 2 and the (f) series generating two bubbles. As seen, the three-end logical input device only can correct in one direction (up or down) with depth 2 of the error and with only one bubble.

SUMMARY OF THE INVENTION

The primary aspect of the present invention is to provide an average bubble correction circuit which will expand the range of bubble error correction and will detect the proper position of the 1/0 state-conversion points of the thermometer codes to low down the error rate that caused by the ROM decoding.

In order to achieve the goals described above, the present invention relates to an average bubble correction circuit comprising a plurality of bubble correction cells that receiving the thermometer codes output from several comparators in an analog to digital converter. The bubble correction cells will detect the output of the thermometer codes and output a set of debugged codes to a state detecting circuit; which can be composed of several conventional Exclusive-Or gate or the three-end logical input device described above, to obtain a set of 1-OF-N codes. The set of 1-OF-N codes will be further input into a decoder and converted to a binary code. Any of the bubble correction cells will select adjacent 2m+1 (m is a natural number) thermometer codes from the plurality of thermometer codes, and determine the state that coming out most often and output a code indicating the state that coming out most often.

Another aspect of the present invention is to provide a bubble correction circuit. With the selection model, the present invention will regard the rare-happened signal "0" or "1" as bubble and to determine the proper position of the 1/0 state-conversion points of the thermometer codes low down the error rate that caused by the ROM decoding. The present invention also expands the range of bubble error correction to cope with the problem of increasing bubble that happened in micro manufacturing process.

The appended drawings will provide further illustration of the present invention, together with the description, serve to explain the principles of the invention.

BRIEF DESCRIPTION OF THE DRAWINGS

FIG. 5A shows the six combinations of the thermometer codes.

FIG. 5B shows the result that detected by the three-end logical input device for the condition "001" in prior art.

FIG. 5C shows the result that detected by the three-end logical input device for the condition "011" in prior art.

FIG. 5D shows the result of bubble correction that the bubble correction cell of the present invention that referring three thermometer codes.

FIG. 8 shows the true-false table of the bubble correction cell of the present invention.

DETAILED DESCRIPTION OF THE PRESENT INVENTION

Figure 6:
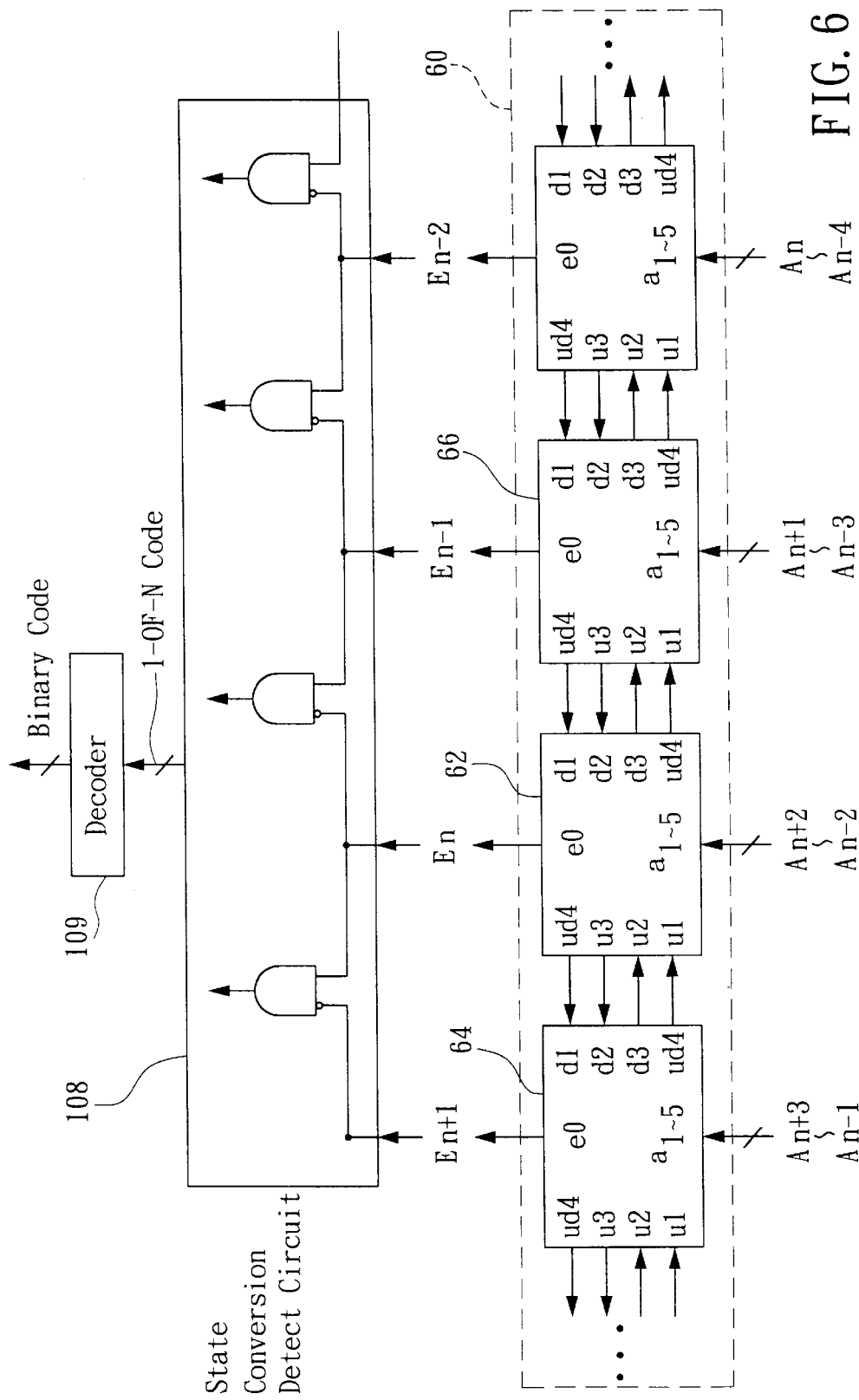
FIG. 6 shows the schematics of the bubble correction circuit of the present invention.

The schematics of the bubble correction circuit of the present invention is shown in FIG. 6. The average bubble correction circuit 60 is composed of a plurality of bubble correction cells. This embodiment is showing the $n^{th}$ stage bubble correction cell 62 that detecting five thermometer codes. The $n^{th}$ stage bubble correction cell 62 is receiving five thermometer codes $A_{n+2} \sim A_{n-2}$ (0 or 1 respectively) which output from the comparators in the analog to digital converter. And the cell also receives the signals outputting from the d3 end and ud4 end of the $(n+1)^{th}$ stage bubble correction cell 64 and the u3 end and ud4 end of the $(n-1)^{th}$ stage bubble correction cell 66. The $n^{th}$ stage bubble correction cell 62 will detect the result of the thermometer codes and the signal and output a distinguishing code $E_n$. When the most occurrence of the set $(A_{n+2}, A_{n+1}, A_n, A_{n-1},$ $A_{n-2}$) is "1", the distinguishing code $E_n$ that outputted from the $n_{th}$ bubble correction cell can be "1" or "0". The most occurrence of the set ($A_{n+2}, A_{n+1}, A_n, A_{n-1}, A_{n-2}$) is "0", the distinguishing code $E_n$ outputted from the $n_{th}$ bubble correction cell can be "0" or "1". The equations are follows:

$E_n = 1$, if $A_{n+2} + A_{n+1} + A_n + A_{n-1} + A_{n-2} >= 3$ $E_n = 0$, otherwise, Wherein, $A_j$ is the $j^{th}$ thermometer code, the value of the $A_j$ is belong to set of 0 and 1. And then the distinguishing codes from every stage bubble correction cell are inputted into a state-conversion detect circuit 108 to obtain a set of 1-OF-N codes. The 1-OF-N codes will be inputted into a decoder 109 for decoding and output a binary code for a circuit.

In the $n^{th}$ bubble correction cell, in order to detect whether the most occurrence of the five selected thermometer code is 0 or 1, three thermometer codes will be selected randomly from the five ones to form one set and totally 10 sets. When the logical value of the thermometer codes in any one set is identical, the logical value will be used as a distinguishing code for output.

In general, when the $n^{th}$ bubble correction cell selecting 2m+1 thermometer codes (m can be any natural number), in order to obtain the distinguishing codes, the m+1 thermometer codes can be selected and form as one set and totally C(2m+1, m+1) sets. When the logical value of the thermometer codes in any one set is identical, the logical value will be used as a distinguishing code for output.

Figure 7A:
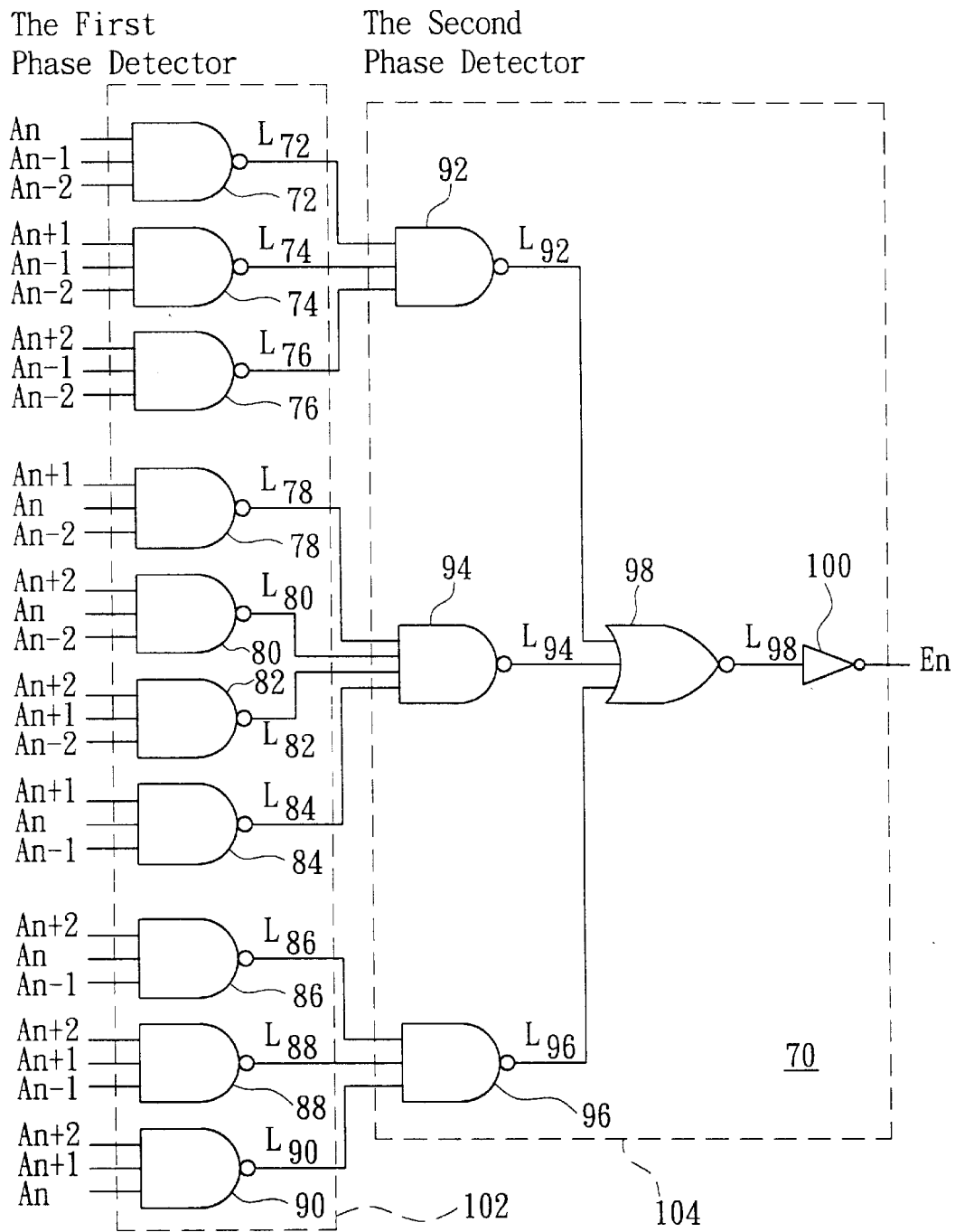
FIG. 7A shows the first embodiment of the bubble correction cell of the present invention.
Figure 7B:
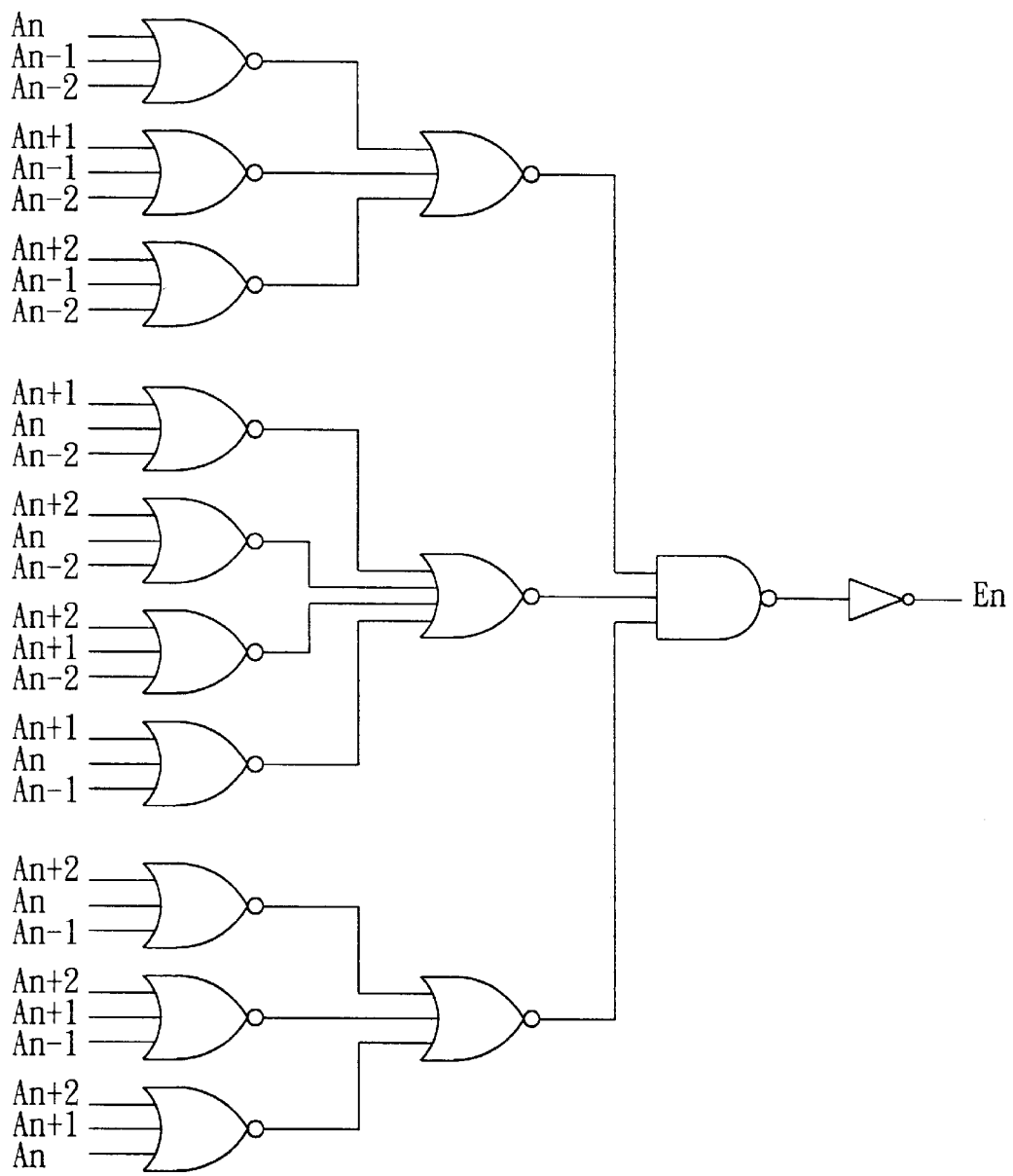
FIG. 7B shows the second embodiment of the bubble correction cell of the present invention.

Two embodiments of the bubble correction cell of the present invention are shown in FIG. 7A and FIG. 7B. In FIG. 7A, the bubble correction cell 70 is composed of the first detector 102 and the second detector 104. The first detector 102 is composed of the NAND gate 72, the NAND gate 74, the NAND gate 76, the NAND gate 78, the NAND gate 80, the NAND gate 82, the NAND gate 84, the NAND gate 86, the NAND gate 88 and the NAND gate 90. The second detector 104 is composed of the NAND gate 92, the NAND gate 94, the NAND gate 96, the NOR gate 98 and the NOT gate 100.

The first input end of the NAND gate 72 receives the thermometer code $A_n$. The second input end of the NAND gate 72 receives the thermometer code $A_{n-1}$. The third input end of the NAND gate 72 receives the thermometer code $A_{n-2}$. And the output end of the NAND gate 72 outputs the logical signal L72. The first input end of the NAND gate 74 receives the thermometer code $A_{n+1}$. The second input end of the NAND gate 74 receives the thermometer code $A_{n-2}$. The third input end of the NAND gate 74 receives the thermometer code $A_{n-2}$. And the output end of the NAND gate 74 outputs the logical signal L74. The first input end of the NAND gate 76 receives the thermometer code $A_{n+2}$. The second input end of the NAND gate 76 receives the thermometer code $A_{n-1}$. The third input end of the NAND gate 76 receives the thermometer code $A_{n-2}$. The output end of the NAND gate 76 outputs the logical signal L76. The first input end of the NAND gate 78 receives the thermometer code $A_{n+1}$. The second input end of the NAND gate 78 receives the thermometer code $A_n$. The third input end of the NAND gate 78 receives the thermometer code $A_{n-2}$. The output end of the NAND gate 78 outputs a logical signal L78. The first input end of the NAND gate 80 receives the thermometer code $A_{n+2}$. The second input end of the NAND gate 80 receives the thermometer code $A_n$. The third input end of the NAND gate 80 receives the thermometer code $A_{n-2}$. The output end of the NAND gate 80 outputs the logical signal L80. The first input end of the NAND gate 82 receives the thermometer code $A_{n+2}$. The second input end of the NAND gate 82 receives the thermometer code $A_{n+1}$. The third input end of the NAND gate 82 receives the thermometer code $A_{n-2}$. The output end of the NAND gate 82 outputs the logical signal L82. The first input end of the NAND gate 84 receives the thermometer code $A_{n+1}$. The second input end of the NAND gate 84 receives the thermometer code $A_n$. The third input end of the NAND gate 84 receives the thermometer code $A_{n-1}$. The output end of the NAND gate 84 outputs the logical signal L84. The first input end of the NAND gate 86 receives the thermometer code $A_{n+2}$. The second input end of the NAND gate 86 receives the thermometer code $A_n$. The third input end of the NAND gate 86 receives the thermometer code $A_{n-1}$. The output end of the NAND gate 86 outputs the logical signal L86. The first input end of the NAND gate 88 receives the thermometer code $A_{n+2}$. The second input end of the NAND gate 88 receives the thermometer code $A_{n+1}$. The third input end of the NAND gate 88 receives the thermometer code $A_{n-1}$. The output end of the NAND gate 88 outputs the logical signal L88. The first input end of the NAND gate 90 receives the thermometer code $A_{n+2}$. The second input end of the NAND gate 90 receives the thermometer code $A_{n+1}$. The third input end of the NAND gate receives the thermometer code $A_n$. The output end of the NAND gate 90 outputs the logical signal L90.

The first input end of the NAND gate 92 receives the logical signal L72 of the NAND gate. The second input end of the NAND gate 92 receives the logical signal L74 of the NAND gate. The third input end of the NAND gate 92 receives the logical signal L76 of the NAND gate. The output end of the NAND gate 92 outputs the logical signal L92 of the NAND gate. The first input end of the NAND gate 94 receives the logical signal L78 of the NAND gate. The second input end of the NAND gate 94 receives the logical signal L80 of the NAND gate. The third input end of the NAND gate 94 receives the logical signal L82 of the NAND gate. The fourth input end of the NAND gate 94 receives the logical signal L84 of the NAND gate. The output end of the NAND gate 94 outputs the logical signal L94 of the NAND gate. The first input end of the NAND gate 96 receives the logical signal L86 of the NAND gate. The second input end of the NAND gate 96 receives the logical signal L88 of the NAND gate. The third input end of the NAND gate 96 receives the logical signal L90 of the NAND gate. The output end of the NAND gate 96 outputs the logical signal L96 of the NAND gate. The first input end of the NOR gate 98 receives the logical signal L92 of the NAND gate. The second input end of the NOR gate 98 receives the logical signal L94 of the NAND gate. The third input end of the NOR gate 98 receives the logical signal L96 of the NAND gate. The output end of the NOR gate outputs the logical signal L98 of the NOR gate. The input end of the NOT gate 100 receives the logical signal L98 of the NOR gate and outputs a distinguishing code $E_n$.

In FIG. 7A, all NAND gates in the first detector 102 can be replaced by the AND gates when "1" is the judgment condition for the first detector 102. In FIG. 7B, all NAND gates in the first detector 102 can be replaced by the OR gates when "0" is the judgment condition for the first detector 102.

Figure 1:
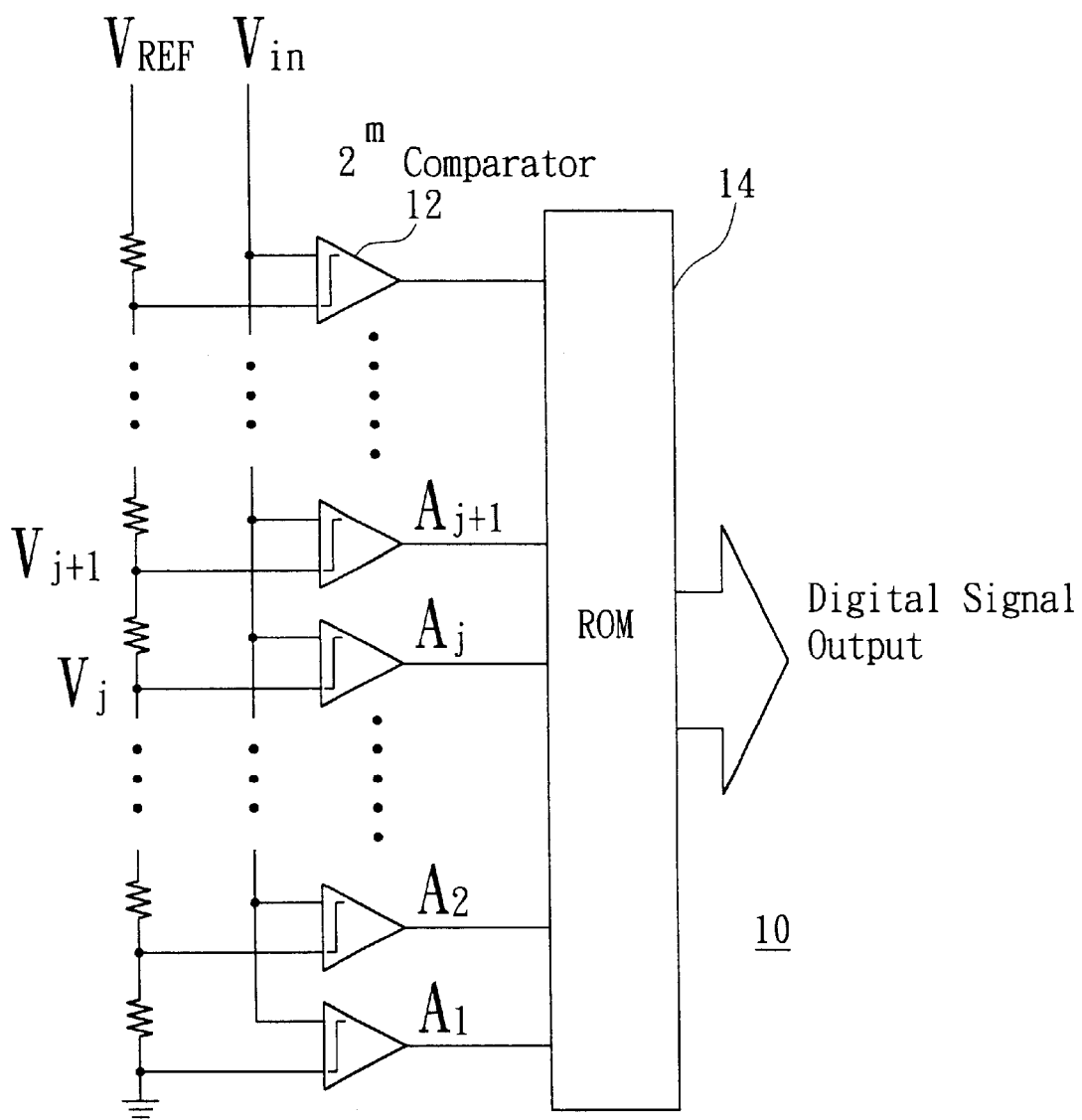
FIG. 1 shows the schematics of the flash analog/digital converter.
Figure 2:
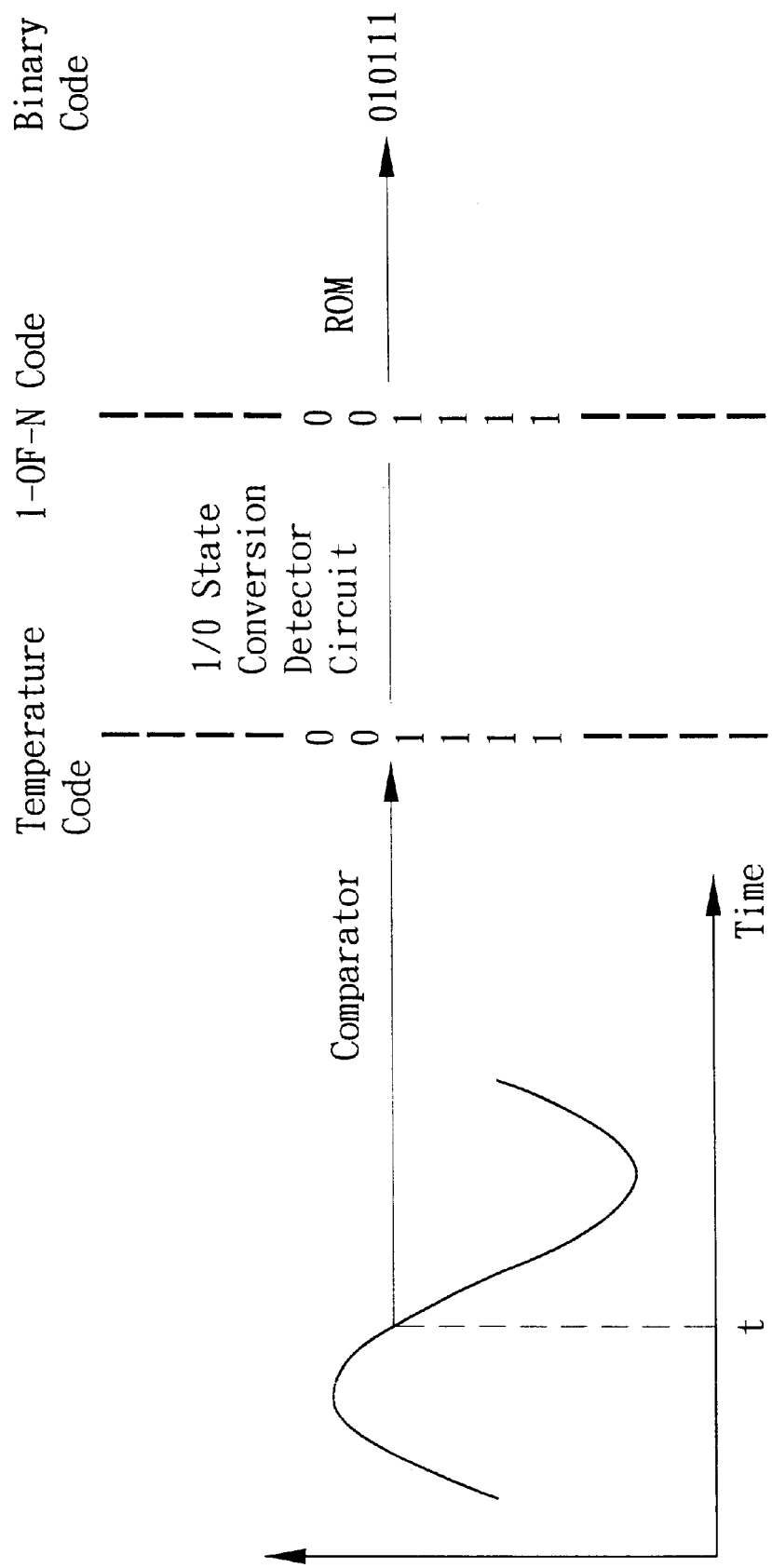
FIG. 2 shows the conversion from the analog signal to the digital signal.
Figure 3B:
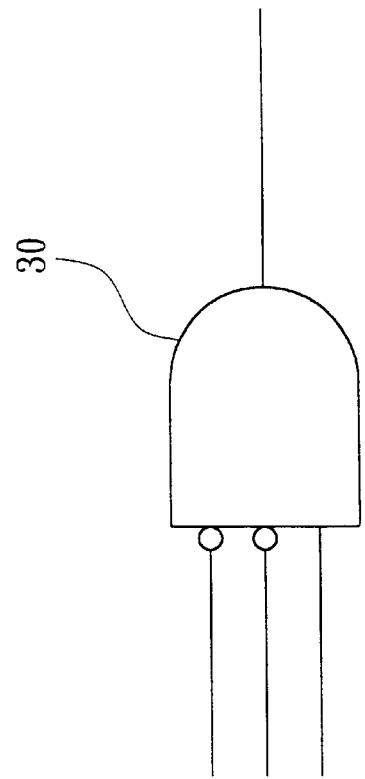
FIG. 3B shows the schematics of the three-end logical input device of 1/0 state-conversion point for the condition of "011" in prior art.
Figure 3A:
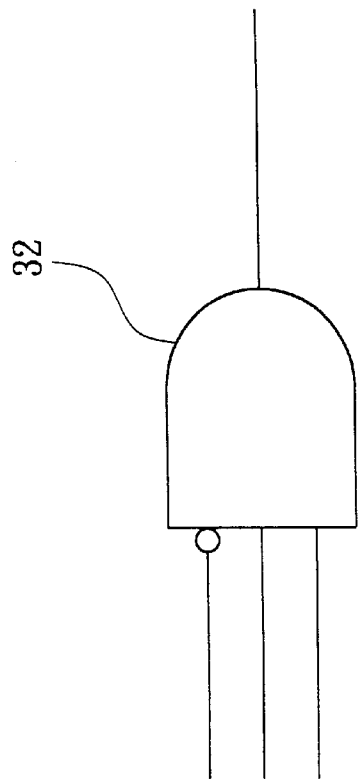
FIG. 3A shows the schematics of the three-end logical input device of 1/0 state-conversion point for the condition of "001" in prior art.
Figure 4:
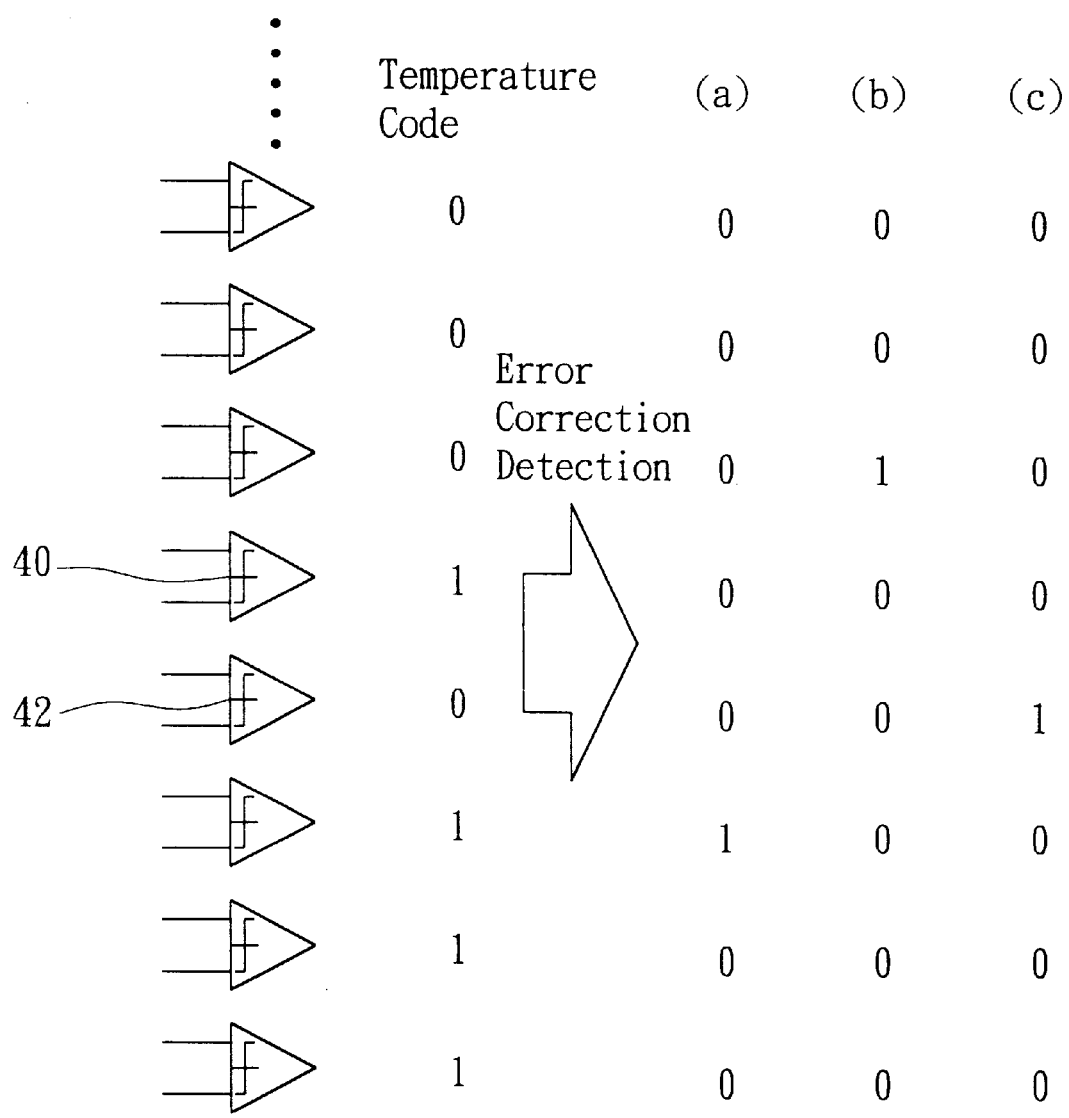
FIG. 4 shows the result that three-end logical input device detecting the occurrence of bubbles in prior art.
Figure 5E:
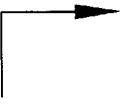
FIG. 5E shows the result of bubble correction that the bubble correction cell of the present invention that referring five thermometer codes.

The true-false table of the bubble correction cell of the present invention is shown in FIG. 8. In this embodiment, the bubble correction cell is proceeding the correction in the thermometer codes that output from five comparators with the manner of bi-direction, 2-depth and two bubbles, and further detect the best point of 1/0 state-conversion point. The 1/0 state-conversion point of the thermometer code can be detected in the selection-mode in the bubble correction circuit. As shown in FIG. 8, in the $n^{th}$ bubble correction cell, the distinguishing code $E_n$ outputted from the $n^{th}$ bubble correction cell is "1" when the number of signals "1" are more than the number of the signals "0". When the number of "1" is fewer than the number of "0", the distinguishing code $E_n$ outputted from the $n^{th}$ bubble correction cell is "0". The equations of the selection-mode are as follows:

$E_n=1$, if $A_{n+2}+A_{n+1}+A_n+A_{n-1}+A_{-2}>=3$ $E_n=0$, otherwise,

Wherein, $E_n$ is the distinguishing code of correction, and $A_j$ is the output of $j^{th}$ comparator and the value of $A_j$ is "0" or "1". The equation above will correct the bubble error of the (a) series, the (b) series, the (c) series, the (d) series, the (e) series and the (f) series in FIG. 5A. The result above is showing in FIG. 5E. It is indicating that, if the number of bubble in any five thermometer codes is less than two, regardless of the direction or the depth, the present invention will correct the error properly and detect the best 1/0 state-conversion point.

Figure 9:
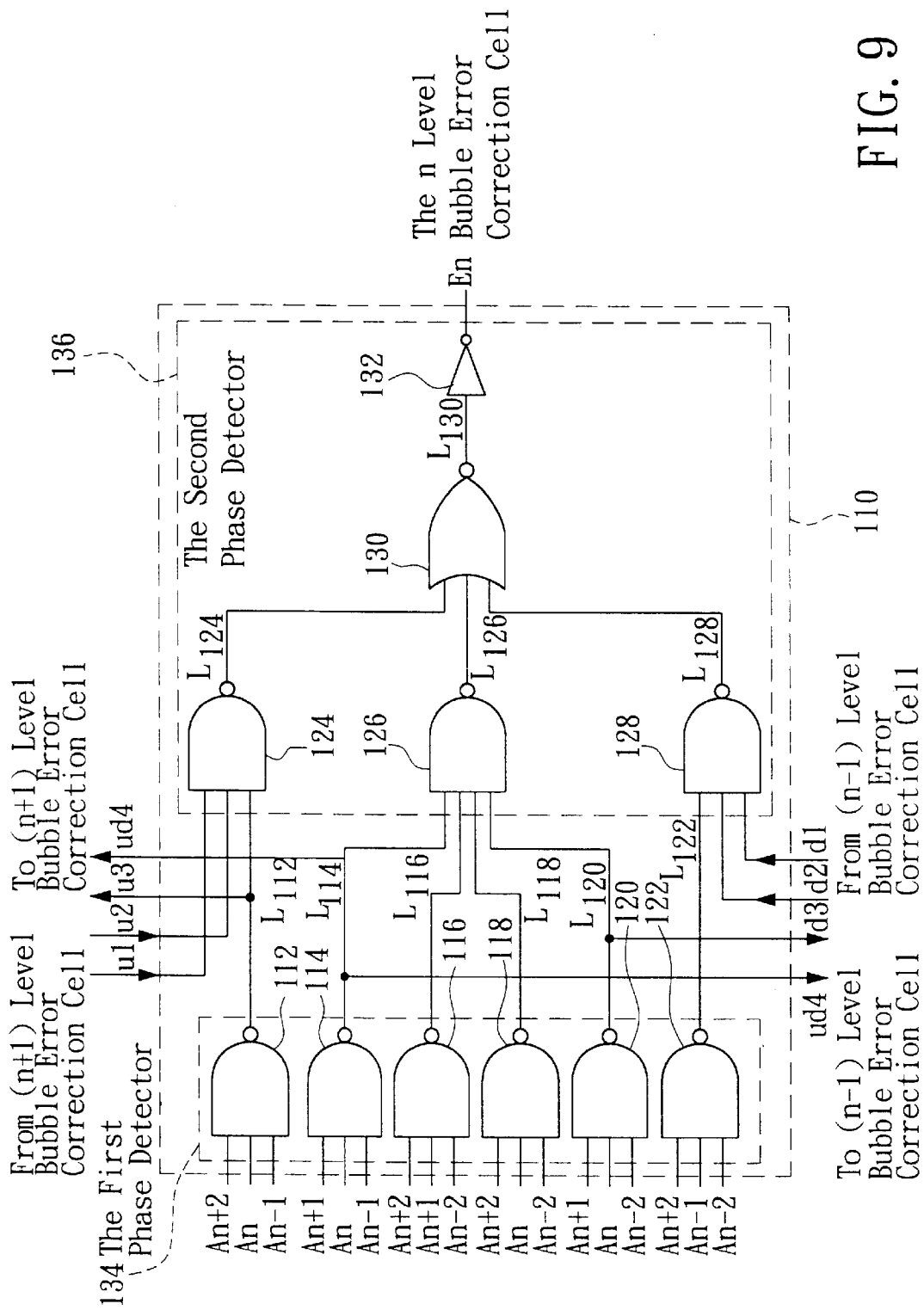
FIG. 9 shows the third embodiment of the bubble correction cell of the present invention.

The third embodiment of the bubble correction cell of the present invention is shown in FIG. 9. The circuit in FIG. 7A can be simplified as the circuit in FIG. 9, in the bubble correction cell 105, the partial logic of the top and the bottom referring output can be shared. The simplified circuit of the $n^{th}$ bubble correction cell 110 is composed of the first detector 134 and the second detector 136. The first detector 134 is composed of the NAND gate 112, the NAND gate 114, the NAND gate 116, the NAND gate 118, the NAND gate 120 and the NAND gate 122. The second detector 136 is composed of the NAND gate 124, the NAND gate 126, the NAND gate 128, the NOR gate 130 and the NOT gate 132.

The first input end of the NAND gate 112 receives the thermometer code $A_{n+2}$. The second input end of the NAND gate 112 receives the thermometer code $A_n$. The third input end of the NAND gate 112 receives the thermometer code $A_{n-1}$. The output end of the NAND gate 112 outputs the logical signal L112 of the NAND gate. The first input end of the NAND gate 114 receives the thermometer code $A_{n+1}$. The second input end of the NAND gate 114 receives the thermometer code $A_n$. The third input end of the NAND gate 114 receives the thermometer code $A_{n-1}$. The output end of the NAND gate 114 outputs the logical signal L114 of the NAND gate. The first input end of the NAND gate 116 receives the thermometer code $A_{n+2}$. The second input end of the NAND gate 116 receives the thermometer code $A_{n+1}$. The third input end of the NAND gate 116 receives the thermometer code $A_{n-2}$. The output end of the NAND gate 116 outputs the logical signal L116 of the NAND gate. The first input end of the NAND gate 118 receives the thermometer code $A_{n+2}$. The second input end of the NAND gate 118 receives the thermometer code $A_n$. The third input end of the NAND gate 118 receives the thermometer code $A_{n-2}$. The output end of the NAND gate 118 outputs the logical signal L118 of the NAND gate. The first input end of the NAND gate 120 receives the thermometer code $A_{n+1}$. The second input end of the NAND gate 120 receives the thermometer code $A_n$. The third input end of the NAND gate 120 receives the thermometer code $A_{n-2}$. The output end of the NAND gate 120 outputs the logical signal L120 of the NAND gate. The first input end of the NAND gate 122 receives the thermometer code $A_{n+2}$. The second input end of the NAND gate 122 receives the thermometer code $A_{n-1}$. The third input end of the NAND gate 122 receives the thermometer code $A_{n-2}$. The output end of the NAND gate 122 outputs the logical signal L122 of the NAND gate.

The first input end of the NAND gate 124 receives the logical signal u1 of the $(n+1)^{th}$ stage bubble correction cell. The second input end of the NAND gate 124 receives the logical signal u2 of the $(n+1)^{th}$ stage bubble correction cell. The third input end of the NAND gate 124 receives the logical signal L112 of the NAND gate and outputs the logical signal L124 of the NAND gate. The first input end of the NAND gate 126 receives the logical signal L114 of the NAND gate. The second input end of the NAND gate 126 receives the logical signal L116 of the NAND gate. The third input end of the NAND gate 126 receives the logical signal L118 of the NAND gate. The fourth input end of the NAND gate 126 receives the logical signal L120 of the NAND gate. The output end of the NAND gate 126 outputs the logical signal L126 of the NAND gate. The first input end of the NAND gate 128 receives the logical signal L122 of the NAND gate. The second input end of the NAND gate 128 receives the logical signal d2 of the $(n-1)^{th}$ stage bubble correction cell. The third input end of the NAND gate 128 receives the logical signal d1 of the $(n-1)^{th}$ stage bubble correction cell. The output end of the NAND gate 128 outputs the logical signal L128. The first input end of the NOR gate 130 receives the logical signal L124 of the NAND gate. The second input end of the NOR gate 130 receives the logical signal L126 of the NAND gate. The third input end of the NOR gate receives the logical signal L128 of the NAND gate. The output end of the NOR gate 130 outputs the logical signal L130 of the NOR gate. The input end of the NOT gate 132 receives the logical signal L130 of the NOR gate. The output end of the NOT gate 132 outputs the distinguishing code $E_n$.

The present invention will expand the correction range with the equation as follows:

$$E_n = 1, \text{ if } \sum_{i=n-k}^{n+k} b_i \geq k+1$$

$E_n=0$, otherwise or $$E_n = 0, \text{ if } \sum_{i=n-k}^{n+k} b_i \geq k+1$$

$E_n=1$, otherwise

Wherein, the $p=2k+1$ represents the p thermometer codes and k is the maximum number of the bubbles which can be corrected (Be aware that only few "0" or "1" will be identified as "Bubble" in a series of bits), bi represents the thermometer code which has not been corrected. $E_n$ represents the distinguishing code outputted from the $n^{th}$ bubble cell.

The present invention relates an average bubble correction circuit. The average bubble correction circuit will identify a few of "0" or "1" signals as the bubbles with the selection mode and will detect the best position of the 1/0 state-conversion point of the thermometer code. With the present invention, the bit error rate of ROM decoding will be decreased, the range of the bubble correction will be expanded to cope with the problem of increase of bubbles happened in small size semiconductor manufacturing.

In this model, when the number of the reference thermometer codes is five in the bubble correction cell, the number of the bubbles that can be corrected is two. And there is no limitation on the bi-direction depth when the number of the bubbles is not more than two. When the number of the reference thermometer codes is seven in the bubble correction cell, the number of the bubbles that can be corrected is three. And any limitation for the bi-direction depth will not be applied when the number of the bubbles is not more than three.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the spirit of the present invention.

What is claimed is:

1. An average bubble correction circuit receiving a plurality of the thermometer codes in order to correct the bubble, and comprising at least one bubble correction cell in which the adjacent 2m+1 thermometer codes are selected from a plurality of the thermometer codes, and detecting the most occurrence amount of the states of the 2m+1 thermometer codes, and outputting a distinguishing code.

2. The average bubble correction circuit of claim 1, wherein, the distinguishing code is the most occurrence of the state of the 2m+1 thermometer codes.

3. The average bubble correction circuit of claim 1, wherein, the distinguishing code is the least occurrence of the state of the 2m+1 thermometer codes.

4. The average bubble correction circuit of claim 1, wherein the m+1 thermometer codes will be selected as a set from 2m+1 thermometer codes and come out total C(2m+1,m+1) sets, when all the logical value of thermometer codes in any said set are the same, the logical value will appear to be the state of the most occurred one.

5. An average bubble correction circuit receiving a plurality of the thermometer codes to correct the bubble error and comprising at least a bubble correction cell in which the adjacent five thermometer codes are selected from said plurality of the thermometer codes, detecting the state of the most occurred of the five thermometer codes, and outputting a distinguishing code according to the state of the most occurred bubbles.

6. The average bubble correction circuit of claim 5, wherein the $n^{th}$ stage bubble correction cell comprises:

a first logical device comprising three input ends, the first input end of the first logical device receiving the $n^{th}$ thermometer code of said thermometer codes, the second input end of the first logical device receiving the $(n-1)^{th}$ thermometer code of said thermometer codes, the third input end of the first logical device receiving the $(n-2)^{th}$ thermometer code of said thermometer codes, and outputting a first logical signal;

a second logical device comprising three input ends, the first input end of the second logical device receiving the $(n+1)^{th}$ thermometer code of said thermometer codes, the second input end of the second logical device receiving the $(n-1)^{th}$ thermometer code of said thermometer codes, the third input end of the second logical device receiving the $(n-2)^{th}$ thermometer code of said thermometer codes, and outputting a second logical signal;

a third logical device comprising three input ends, the first input end of the third logical device receiving the $(n+2)^{th}$ thermometer code of said thermometer codes, the second input end of the third logical device receiving the $(n-1)^{th}$ thermometer code of these thermometer codes, the third input end of the third logical device receiving the $(n-2)^{th}$ thermometer code of said thermometer codes, and outputting a third logical signal;

a fourth logical device comprising three input ends, the first input end of the fourth logical device receiving the $(n+1)^{th}$ thermometer code of said thermometer codes, the second input end of the fourth logical device receiving the $n^{th}$ thermometer code of said thermometer codes, the third input end of the fourth logical device receiving the $(n-2)^{th}$ thermometer code of said thermometer codes, and outputting a fourth logical signal;

a fifth logical device comprising three input ends, the first input end of the fifth logical device receiving the $(n+2)^{th}$ thermometer code of said thermometer codes, the second input end of the fifth logical device receiving the $n^{th}$ thermometer code of said thermometer codes, the third input end of the fifth logical device receiving the $(n-2)^{th}$ thermometer code of said thermometer codes, and outputting a fifth logical signal;

a sixth logical device comprising three input ends, the first input end of the sixth logical device receiving the $(n+2)^{th}$ thermometer code of said thermometer codes, the second input end of the sixth logical device receiving the $(n+1)^{th}$ thermometer code of said thermometer codes, the third input end of the sixth logical device receiving the $(n-2)^{th}$ thermometer code of said thermometer codes, and outputting a sixth logical signal;

a seventh logical device comprising three input ends, the first input end of the seventh logical device receiving the $(n+1)^{th}$ thermometer code of said thermometer codes, the second input end of the seventh logical device receiving the $n^{th}$ thermometer code of said thermometer codes, the third input end of the seventh logical device receiving the $(n-1)^{th}$ thermometer code of said thermometer codes, and outputting a seventh logical signal;

an eighth logical device comprising three input ends, the first input end of the eighth logical device receiving the $(n+2)^{th}$ thermometer code of said thermometer codes, the second input of the eighth logical device receiving the $n^{th}$ thermometer code of said thermometer codes, the third input end of the eighth logical device receiving the $(n-1)^{th}$ thermometer code of said thermometer codes, and outputting an eighth logical signal;

a ninth logical device comprising three input ends, the first input end of the ninth logical device receiving the $(n+2)^{th}$ thermometer code of said thermometer codes, the second input end of the ninth logical device receiving the $(n+1)^{th}$ thermometer code of said thermometer codes, the third input end of the ninth logical device receiving the $(n-1)^{th}$ thermometer code of said thermometer codes, and outputting a ninth logical signal;

a tenth logical device comprising three input ends, the first input end of the tenth logical device receiving the $(n+2)^{th}$ thermometer code of said thermometer codes, the second input end of the tenth logical device receiving the $(n+1)^{th}$ thermometer code of said thermometer codes, the third input end of the tenth logical device receiving the $n^{th}$ thermometer code of said thermometer codes, and outputting a tenth logical signal; and a distinguishing device, when the same thermometer codes received by the three input ends of any of said logical devices, outputting a distinguishing code according to the logical value of said thermometer code.

7. The average bubble correction circuit of claim 6, wherein the distinguishing device comprising:
   an eleventh logical device comprising three input ends, the first input end of the eleventh logical device receiving the first logical signal, the second input end of the eleventh logical device receiving the second logical signal, the third input end of the eleventh logical device receiving the third logical signal, and outputting an eleventh logical signal;
   a twelfth logical device comprising four input ends, the first input end of the twelfth logical device receiving the fourth logical signal, the second input end of the twelfth logical device receiving the fifth logical signal, the third input end of the twelfth logical device receiving the sixth logical signal, the fourth input end of the twelfth logical device receiving the seventh logical signal device, and outputting a twelfth logical signal;
   a thirteenth logical device comprising three input ends, and the first input end of the thirteenth logical device receiving the eighth logical signal, the second input end of the thirteenth logical device receiving the ninth logical signal, the third input end of the thirteenth logical device receiving the tenth logical signal and outputting a thirteenth logical signal;
   a fourteenth logical device comprising three input ends, the first input end of the fourteenth logical device receiving the eleventh logical signal, the second input end of the fourteenth logical device receiving the twelfth logical signal, the third input end of the fourteenth logical device receiving the thirteenth logical signal, and outputting a fourteenth logical signal; and
   a fifteenth logical device receiving the fourteenth logical signal, and outputting the distinguishing code.

8. The average bubble correction circuit of claim 6, wherein the first logical device, the second logical device, the third logical device, the fourth logical device, the fifth logical device, the sixth logical device, the seventh logical device, the eighth logical device, the ninth logical device and the tenth logical device are all NANA gates.

9. The average bubble correction circuit of claim 7, wherein the eleventh logical device, the twelfth logical device and the thirteenth logical device are all NAND gates, the fourteenth logical device is the NOR gate, and the fifteenth logical device is the NOT gate.

10. The average bubble correction circuit of claim 6, wherein the first logical device, the second logical device, the third logical device, the fourth logical device, the fifth logical device, the sixth logical device, the seventh logical device, the eighth logical device, the ninth logical device and the tenth logical device are all NOR gates.

11. The average bubble correction circuit of claim 7, wherein the eleventh logical device, the twelfth logical device and the thirteenth logical device are all NOR gates, the fourteenth logical device is the NAND gate, and the fifteenth logical device is the NOT gate.

12. The average bubble correction circuit of claim 5, wherein the $n^{th}$ stage bubble correction cell comprising:
   a first logical device comprising three input ends, the first input end of the first logical device receiving the $(n+2)^{th}$ thermometer code of said thermometer codes, the second input end of the first logical device receiving the $n^{th}$ thermometer code of said thermometer codes, the third input end of the first logical device receiving the $(n-1)^{th}$ thermometer code of said thermometer codes, and outputting a first logical signal;
   a second logical device comprising three input ends, the first input end of the second logical device receiving the $(n+1)^{th}$ thermometer code of said thermometer codes, the second input end of the second logical device receiving the $n^{th}$ thermometer code of said thermometer codes, the third input end of the second logical device receiving the $(n-1)^{th}$ thermometer code of said thermometer codes, and outputting a second logical signal;
   a third logical device comprising three input ends, the first input end of the third logical device receiving the $(n+2)^{th}$ thermometer code of said thermometer codes, the second input end of the third logical device receiving the $(n+1)^{th}$ thermometer code of said thermometer codes, the third input end of the third logical device receiving the $(n-2)^{th}$ thermometer code of said thermometer codes, and outputting a third logical signal;
   a fourth logical device comprising three input ends, the first input end of the fourth logical device receiving the $(n+2)^{th}$ thermometer code of said thermometer codes, the second input end of the fourth logical device receiving the $n^{th}$ thermometer code of said thermometer codes, the third input end of the fourth logical device receiving the $(n-2)^{th}$ thermometer code of said thermometer codes, and outputting a fourth logical signal;
   a fifth logical device comprising three input ends, the first input end of the fifth logical device receiving the $(n+1)^{th}$ thermometer code of said thermometer codes, the second input end of the fifth logical device receiving the $n^{th}$ thermometer code of said thermometer codes, the third input end of the fifth logical device receiving the $(n-2)^{th}$ thermometer code of said thermometer codes, and outputting a fifth logical signal;
   a sixth logical device comprising three input ends, the first input end of the sixth logical device receiving the $(n+2)^{th}$ thermometer code of said thermometer codes, the second input end of the sixth logical device receiving the $(n-1)^{th}$ thermometer code of said thermometer codes, the third input end of the sixth logical device receiving the $(n-2)^{th}$ thermometer code of said thermometer codes, and outputting a sixth logical signal; and
   a distinguishing device, when the same thermometer codes are received by the three input ends of any of said logical devices, outputting a distinguishing code according to the logical value of said thermometer code.

13. The average bubble correction circuit of claim 12, wherein the distinguishing device comprising:
   a seventh logical device comprising three input ends, the first input end of the seventh logical device receiving a first input signal of the $(n+1)^{th}$ stage bubble correction cell, the second input end of the seventh logical device receiving a second input signal of the $(n+1)^{th}$ bubble correction cell, the third input end of the seventh logical device receiving the first logical signal, and outputting a seventh logical signal;
   a eighth logical device comprising four input ends, the first input end of the eighth logical device receiving the second logical signal, the second input end of the eighth logical device receiving the third logical signal, the third input end of the eighth logical device receiving the fourth logical signal, the fourth input end of the eighth logical device receiving the fifth logical signal, and outputting an eighth logical signal;

a ninth logical device comprising three input ends, the first input end of the ninth logical device receiving the sixth logical signal, the second input end of the ninth logical device receiving a first input signal of the $(n-1)^{th}$ bubble correction cell, the third input end of the ninth logical device receiving a second input signal of the $(n-1)^{th}$ stage bubble correction cell, and outputting a ninth logical signal;

a tenth logical device comprising three input ends, the first input end of the tenth logical device receiving the seventh logical signal, the second input end of the tenth logical device receiving the eighth logical signal, the third input end of the tenth logical device receiving the ninth logical signal, and outputting a tenth logical signal; and an eleventh logical device receiving the tenth logical signal, and outputting the distinguishing code.

14. The average bubble correction circuit of claim 12, wherein the first logical device, the second logical device, the third logical device, the fourth logical device, the fifth logical device and the sixth logical device are all NAND gates.

15. The average bubble correction circuit of claim 13, wherein the seventh logical device, the eighth logical device and the ninth logical device are all NAND gates, the tenth logical device is a NOR gate, and the eleventh logical device is a NOT gate.

16. An average bubble correction circuit which receives a plurality of the thermometer codes, comprising:

at least a bubble correction cell selecting the adjacent 2m+1 thermometer codes in said plurality of the thermometer codes and detecting the state of the most occurred thermometer codes of said 2m+1 thermometer codes, and outputting a distinguishing code;

a state-conversion detecting circuit receiving the distinguishing code outputted from all bubble correction cells, and transferring to a set of 1-OF-N codes; and a decoder receiving the 1-OF-N codes outputting from the state-conversion detecting circuit, and outputting a binary code.

17. A average bubble correction method comprising:

receiving a plurality of the thermometer codes;

selecting the adjacent 2m+1 thermometer codes in said plurality of the thermometer codes;

detecting the state of the most occurrence of the 2m+1 thermometer codes; and outputting a distinguishing code in response to the state of the most occurred thermometer codes.

18. The average bubble correction method of claim 17, wherein the distinguishing code is the state of the most occurrence of the 2m+1 thermometer codes.

19. The average bubble correction method of claim 17, wherein the distinguishing code is the state of the least occurrence of the 2m+1 thermometer codes.

* * * * *